(12) United States Patent
Oiao et al.

(10) Patent No.: US 6,214,743 B1
(45) Date of Patent: Apr. 10, 2001

(54) METHOD AND STRUCTURE FOR MAKING SELF-ALIGNED CONTACTS

(75) Inventors: Jianmin Oiao, Fremont; James Nulty, San Jose, both of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/326,432

(22) Filed: Jun. 4, 1999

(51) Int. Cl.$^7$ .................................................. H01L 21/00
(52) U.S. Cl. ........................ 438/723; 438/738; 438/743
(58) Field of Search ..................................... 438/712, 723, 438/738, 743; 216/79, 41, 51, 67

(56) References Cited

U.S. PATENT DOCUMENTS

| | | |
|---|---|---|
| 5,516,708 | 5/1996 | Li et al. . |
| 5,886,410 | 3/1999 | Chiang et al. . |
| 5,932,491 | 8/1999 | Wald et al. ........................ 438/692 X |
| 6,054,394 | 4/2000 | Wang .................................... 438/753 |

OTHER PUBLICATIONS

Sunami et al., "Selective Oxide Coating of Silicon Gate (SELOCE)", *Proceedings of the 10$^{th}$ Conference on Solid State Devices*, Tokyo, 1978; *Japanese Journal of Applied Physics*, vol. 18 (1979) Supplement 18–1, pp. 255–260.

Cuthbertson et al., "Self–Aligned Transistors with Polysilicon Emitters for Bipolar VLSI", *IEEE Journal of Solid--State CircuitsIEEE Journal of Solid–State Circuits*, vol. SC–20, No. 1, Feb. 1985.

Primary Examiner—William Powell
(74) Attorney, Agent, or Firm—Bradley T. Sako

(57) ABSTRACT

According to one embodiment (100), a method of forming contacts may include forming structures that include sidewalls (102). A first insulating layer can be deposited (104). A second insulating layer can then be deposited over the first insulating layer (106). The second insulating layer can be patterned to form a hard etch mask (108). Contact holes can be etched through the second insulating layer using the hard etch mask as a contact hole etch mask (110). A second insulating layer can have a dielectric constant that is low with respect to other hard etch mask materials, such as silicon nitride. A hard etch mask formed from a second insulating layer can result in contact holes having lower aspect ratios than conventional approaches.

20 Claims, 9 Drawing Sheets

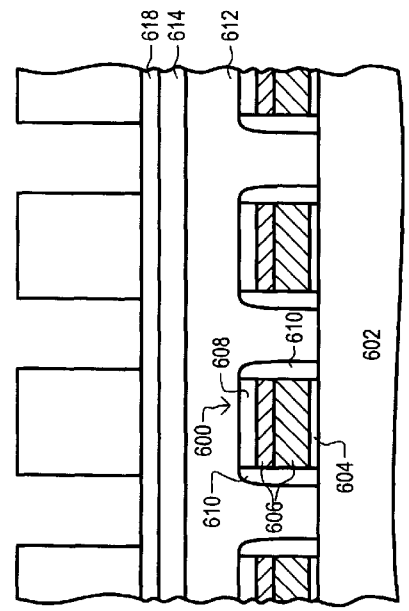
FIG. 6A BACKGROUND ART
FIG. 6B BACKGROUND ART
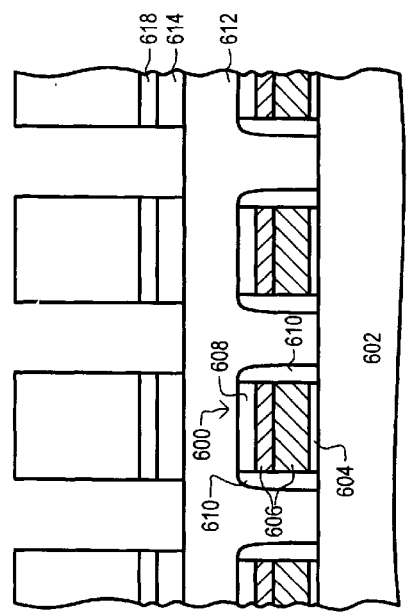
FIG. 6C BACKGROUND ART
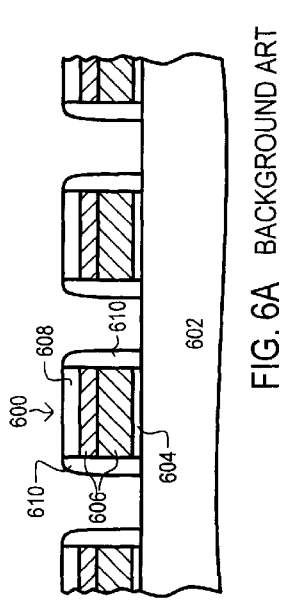
FIG. 6D BACKGROUND ART
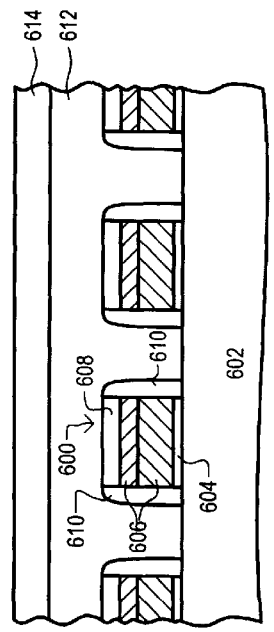
FIG. 6E BACKGROUND ART

METHOD AND STRUCTURE FOR MAKING SELF-ALIGNED CONTACTS

TECHNICAL FIELD

The present invention relates generally to the fabrication of semiconductor devices, and more particularly the formation of contacts holes and/or contact structures in a semiconductor device.

BACKGROUND OF THE INVENTION

Integrated circuits can typically include various layers of conductive, semiconductive, and/or insulating materials. For example, an integrated circuit may include a substrate in which a number of active devices (such as transistors) may be formed. Such active devices may then be connected to one another by one or more conductive or semiconductive layers. The interconnecting conducting layers may be separated from one another by insulating layers.

Insulating layers typically provide electrical isolation between conductive layers. While insulating layers can be formed from a variety of materials, one consideration in selecting an insulating material can be the dielectric constant of the material. If a high dielectric constant material isolates a conductive line from a substrate, "parasitic" capacitance and/or transistor effects can occur.

Conductive or semiconductive layers may be formed from a single layer of material, or alternatively, include one or more conductive (or semiconductive) materials. As just a few examples, such a layer can include a conventionally doped polycrystalline silicon (polysilicon) and "silicide" (silicon-metal alloy). Alternatively, a conducting layer can include a titanium(Ti)-tungsten(W) alloy layered onto bulk aluminum, with an underlying barrier layer comprising Ti, Ti-nitride (TIN), or a Ti alloy. Similarly, insulating layers can also be composites. As just one example, an insulating layer may include a "doped" silicon dioxide ("oxide") and an "undoped" silicon oxide (undoped silicate glass or "USG"). The doped silicon oxide can include dopant elements, such as boron and phosphorous, while the undoped silicon oxide will be essentially free of dopant elements. Phosphorous doped silicon dioxide (phosphosilicate glass or "PSG") can provide advantageous ion gettering and step coverage properties. Boron and phosphorous doped silicon dioxide (borophosphosilicate glass or "BPSG") can also provide such advantages, and can be formed at lower temperatures.

Different conductive or semiconductive layers can be connected to one another by contacts and/or vias. Contacts and/or vias can include contact holes that extend through one or more insulating layers. Conventionally, contacts can connect a substrate to a conductive or semiconductive layer, while a via can connect two different conductive or semiconductive layers to one another.

A conventional way of forming a contact hole in one or more insulating layers can include lithography and etch steps. Lithography can be used to form a pattern over an insulating layer (that includes the location of contact holes). An etch step can transfer the pattern onto the insulating layer.

One concern with certain contact structures can be the alignment of a contact with a lower conducting layer. Because a contact is usually formed by etching a hole through an insulating layer to an underlying conductive or semiconductive, it is desirable for the etched hole to be situated directly over the desired contact location in the lower conducting layer. Further, it may be desirable to ensure that a contact hole can be sufficiently insulated from other conductive lines. For example, in the case of semiconductor devices having insulated gate field effect transistors (IGFETs), such as metal-oxide-semiconductor FETs (MOSFETs), it is desirable to have a contact hole aligned with a source or drain, but at the same time, be sufficiently insulated from a gate conductor.

Another concern regarding contacts and/or vias can be the area of the contact. The area of a contact can be of concern as a substrate on which a contact is formed can also include other important features, such as transistor channels, transistor isolation structures, transistor diffusion regions, and/or device wells. Thus, reductions in contact size can provide more area for other features and/or reduce the overall size of an integrated circuit device. Further, in many processes contact area may have a minimum requirement in order to ensure a low enough contact resistance value. Thus, it is desirable that a contact forming process be capable of meeting a minimum contact resistance value.

Various factors may contribute to reducing contact area. One such factor is that of contact aspect ratio (AR). An aspect ratio can describe the ratio between a contact height and width, when viewed in cross section. The higher the aspect ratio, the more difficult it may be to form the contact.

To better understand the formation of certain integrated circuit structures, including contacts and contact holes, a conventional self-aligned contact (SAC) approach is set forth in FIGS. 5 and 6A–6G. FIG. 5 is a flowchart illustrating the general steps involved in forming a self-aligned contact for an integrated circuit that includes MOSFETs. FIGS. 6A–6G set forth a number of side cross-sectional views of a portion of an integrated circuit following the various steps described in FIG. 5.

The conventional process set forth in FIG. 5 is designated by the general reference character 500. The process 500 can begin by forming MOSFET gate stacks having sidewalls (step 502). A portion of an integrated circuit following step 502 is set forth in FIG. 6A. A MOSFET gate stack 600 can be formed on a substrate 602, and include a gate oxide 604, conductive portions 606, and an insulating portion 608. Sidewalls 610 are also set forth in FIG. 6A.

It is noted that a substrate 602 can include isolation structures formed therein by a previous substrate isolation structure forming step. As just two examples, a substrate 602 can include shallow trench isolation structures and/or local oxidation of silicon (LOCOS) structures. Further, a substrate 602 may also include doped portions formed with previous and/or subsequent doping steps, such as transistor sources, drains, channels, and device wells.

A conventional process 500 can continue with the deposition of an insulating layer of BPSG and USG (step 504). A portion of an integrated circuit following step 504 is set forth in FIG. 6B. Referring now to FIG. 6B, the integrated circuit portion includes a BPSG layer 612 and an USG layer 614 formed over the BPSG layer 612. The BPSG and USG layers (612 and 614) may be formed over MOSFET gate stacks 600 and may be deposited using chemical vapor deposition (CVD) methods.

The conventional process 500 can continue with lithography and etch steps. A photoresist layer can be deposited on a USG layer 614 (step 506). Referring to FIG. 6C, an example of a portion of semiconductor device following a step 506 is shown in a side cross sectional view. A photoresist layer ("resist") can include a photoresist material 616 and a bottom antireflective coating (BARC) 618.

The photoresist material 616 can be patterned (step 508). Typically, a photoresist material 616 can be patterned by selectively exposing portions of the photoresist material to a radiation source. Typically a photomask can be used to establish the pattern. Radiation sources can include various light sources, including coherent light, from various spectrums including the visible spectrum and ultraviolet spectrum. Other methods can utilize X-rays, electron beam (e-beam), or ion beams to form a pattern in a photoresist material 616, to name but a few examples. E-beam and ion beam systems may not require a photomask.

A BARC 618 can reduce deleterious "corner" effects and/or other undesirable developing artifacts that may occur with smaller geometry devices.

Portions of the photoresist material 616 can then be removed according the pattern developed by the exposure to radiation. A portion of a semiconductor device after removal of photoresist material is shown in FIG. 6D. Once selected portions of the photoresist material 616 are removed, the photoresist material 616 can be "baked" to form an etch mask. In this way, in a conventional process 500, photoresist material serves as an etch mask.

A photoresist material 616 can have a predetermined thickness when deposited. Consequently, a resulting etch mask can also have a predetermined thickness. In the example of FIG. 6D, the photoresist etch mask exposes portions of the BARC 618, below which a contact hole may be formed.

Once an etch mask of photoresist is formed, a conventional process can then remove those portions of the BARC 614 and USG 614 that are situated below openings in the photoresist etch mask (step 510). A portion of a semiconductor device following the removal of a BARC 618 and USG layer 614 is shown in FIG. 6E.

A conventional process 500 can proceed with a SAC etch (step 512). FIG. 6F shows a portion of semiconductor device following a SAC etch. A SAC etch can form etch holes 620 that extend through a BPSG layer 612 to a substrate 602. As shown in FIG. 6F, the resulting contact holes 620 may be "self-aligned" with the MOSFET gate stacks 600. The self-alignment occurs by the insulating portions 608 and sidewalls portions 610 insulating conductive portions 606 from contact holes 620. As a result, a minimum spacing requirement between the edges of a contact hole 620 and a MOSFET gate stack 600 may not be necessary.

A conventional SAC etch can have a high degree of selectivity between a photoresist etch mask and a BPSG layer 612. That is, the rate at which BPSG can be etched may be substantially faster than the rate at which the photoresist etch mask can be etched.

A conventional process 500 can continue by removing a photoresist etch mask (step 514). A photoresist etch mask can be removed with a plasma etch that etches photoresist at a substantially faster rate than other exposed semiconductor device materials. Such a removal of a photoresist etch mask with a plasma etch is often referred to as "ashing."

While the described conventional process may produce desired contact holes at certain geometries (i.e., certain contact widths), as semiconductor device manufacturing processes provide smaller and smaller features, such conventional contact approaches may be inadequate. Smaller contact feature sizes may result in larger aspect ratios.

As just one example, a semiconductor device fabricated according to a conventional approach may include contacts of about 0.30 µm. Such a contact formed adjacent to some MOSFET gate stacks can have an aspect ratio of about 2.5:1.

However, when a contact hole is considered with its corresponding photoresist etch mask, its aspect ratio can be larger. This can best understood with reference to FIGS. 6F and 6G. In FIG. 6G a contact hole 620 that does not include the photoresist mask can have an aspect ratio of about 2.5:1. If a photoresist etch mask is included as part of a contact hole, as shown in FIG. 6F, a contact hole 620 can have an aspect ration of about 5:1.

Accordingly, if contact size decreases while photoresist etch mask thickness remains the same (or does not decrease proportionally), contact hole aspect ratios may increase to the point where a contact hole cannot be formed. This is illustrated in FIG. 7 which shows a side cross sectional view of an attempted formation of contact holes 720. Contact holes 720 (when photoresist mask portions are included) have too high a desired aspect ratio. In the particular example of FIG. 7, contact holes 720 are formed partially through a BPSG layer 712 and fail, as they do not expose a portion of a substrate 700. A contact hole may also fail by not providing sufficient contact area (i.e., exposing a sufficient amount of substrate area).

Alternate conventional etch processes can form contact holes without etch masks formed from photoresist. Such approaches include "hard" etch masks. Conventional hard etch masks may be etch masks formed from a deposited material that itself can be etched into a desired pattern. Nitride and polysilicon are two conventional hard mask materials. Polysilicon can be undesirable as a hard mask because it can be difficult to remove after it is used. Nitride can be undesirable as a hard mask because it can introduce a relatively high dielectric constant material between conductive layers.

In light of the conventional approach set forth above, it would be desirable to provide a way of forming contacts that can overcome the drawbacks described above.

It would also be desirable to form such contacts through an insulating material that includes PSG and/or BPSG, and therefore include the advantages of such materials.

It would further be desirable that such contacts be self-aligned contacts for an IGFET, as IGFET contact size can play an important role in reducing the overall size of an integrated circuit.

It would further be desirable that such contacts have relatively small geometries, for example 0.25 µm or less, or more desirably, 0.18 µm or less.

SUMMARY OF THE INVENTION

According to the disclosed embodiments of the invention, methods and structures for forming self-aligned contacts are set forth in a series of charts and diagrams. The disclosed methods and structures can provide hard etch masks for self-aligned contacts that can result in more favorable contact hole aspect ratios. According to selected embodiments of the invention, a self-aligned contact hard etch mask can be formed from undoped silicon dioxide ($SiO_2$ or USG). USG can introduce a material having a relatively low dielectric constant (as compared to silicon nitride, for example).

According to one aspect of an embodiment, a USG hard etch mask can be formed over a layer of borophosphosilicate glass (BPSG). A subsequent etch can have a selectivity between BPSG and USG.

According to another aspect of an embodiment, a USG hard etch mask can be formed over a layer of phosphosilicate glass (PSG). A subsequent etch can have a selectivity between PSG and USG.

According to another aspect of an embodiment, the USG hard etch mask can function as a mask for contact holes having geometries of 0.25 μm or less.

According to another aspect of an embodiment, the USG hard etch mask can function as a mask for contact holes having geometries of 0.18 μm or less.

According to another aspect of an embodiment, contact holes that include the USG hard etch mask can have aspect ratios of less than 8:1.

According to another aspect of an embodiment, contact holes that include the USG hard etch mask can have aspect ratios of less than 6:1.

BRIEF DESCRIPTION OF THE DRAWINGS

FIGS. 6A to 6G are side cross-sectional views of a semiconductor device according to the conventional approach of FIG. 5.

DETAILED DESCRIPTION OF THE EMBODIMENTS

Various embodiments will now be described in conjunction with a number of charts and diagrams. The embodiments set forth approaches to forming self-aligned contact holes with a hard etch mask formed from undoped silicate glass ($SiO_2$ or "USG"). A hard etch mask formed of USG can result in contact holes having lower aspect ratios than conventional approaches for forming contact holes of like size.

Figure 1:
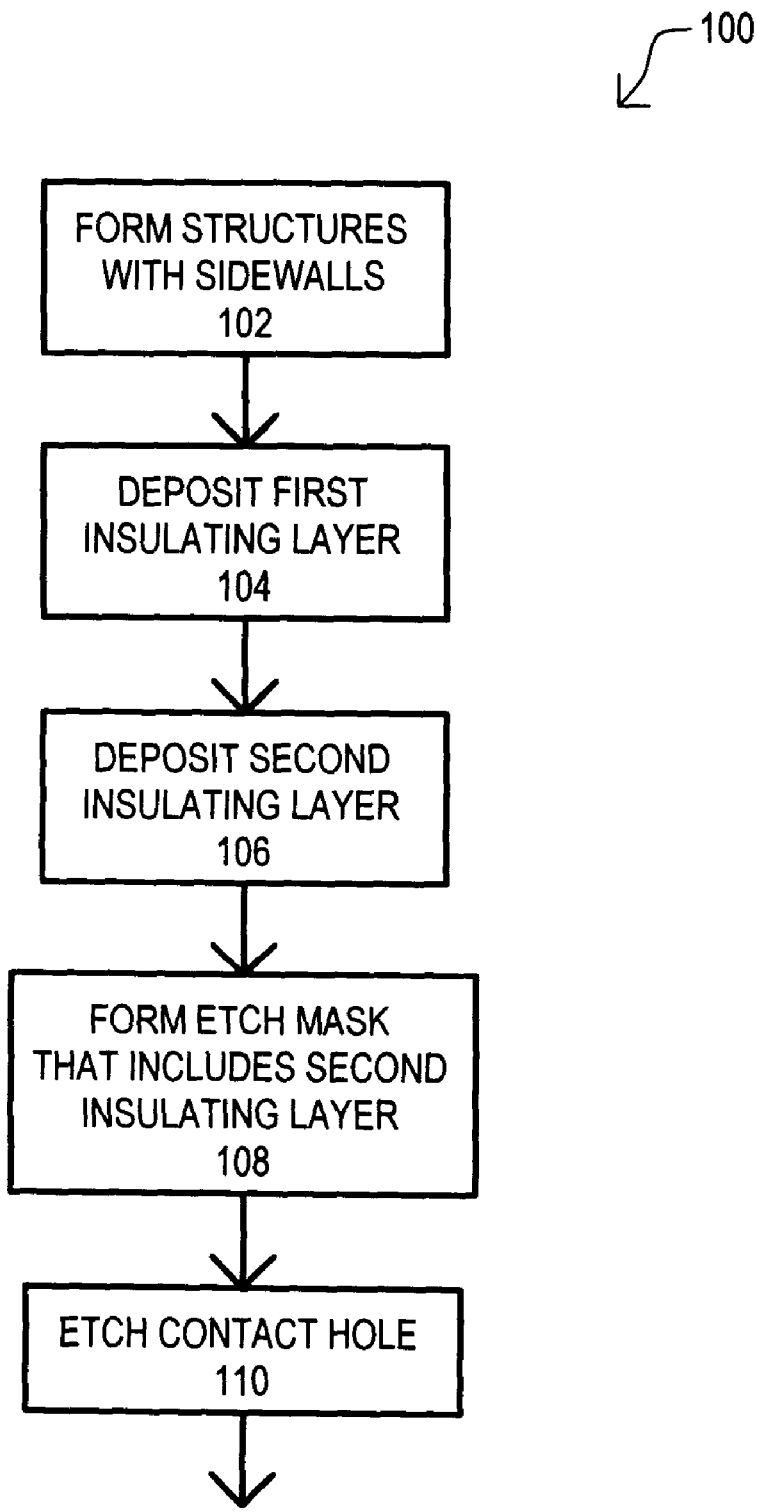
FIG. 1 is a flow diagram of a first embodiment.

Referring now to FIG. 1, a flow diagram is set forth showing a method of forming a contact hole according to a first embodiment. The first embodiment is designated by the general reference character 100, and can include forming a structure with a sidewall (step 102). A sidewall may insulate a structure in a lateral direction from a contact hole. One example of a portion of an integrated circuit following a step 102 is set forth in a side cross-sectional view in FIG. 2A.

Figure 2A:
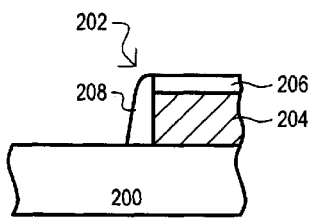
FIGS. 2A to 2E are side cross-sectional views of a semiconductor device according to a first embodiment.

FIG. 2A includes a substrate 200 on which a structure 202 may be formed. A substrate 200 can provide a surface on which structures may be formed and/or in which active devices (such as transistors) may be formed. A substrate 200 may include a generally monocrystalline semiconductor substrate that can have portions insulated from one another (e.g., by local oxidation of silicon (LOCOS), shallow trench isolation (STI), or silicon-on-insulator (SOI), to name but a few limited example).

Some of the possible ways in which a structure 202 may be formed can include etching a substrate 200, and/or depositing one or more layers and then etching such deposited layers. A structure 202 may include a conductive (or semiconductive) portion 204 and a top insulating portion 206. A top insulating portion 206 may isolate a conductive (or semiconductive) portion 204 from a contact hole that overlaps a structure 202.

Also included in FIG. 2A is a sidewall 208. A sidewall 208 may isolate a conductive (or semiconductive) portion 204 from a contact hole that can be formed next to, or overlap a structure 202. One way in which a sidewall 208 may be formed, can be by depositing an insulating layer over the sides of a structure 202, and then anisotropically etching the insulating layer. Such a sidewall (also referred to as a "spacer") can preferably comprise a material such as silicon dioxide ($SiO_2$) and/or silicon nitride ($Si_3N_4$).

A first embodiment 100 may also include depositing a first insulating layer (step 104). A first insulating layer can insulate a structure 202 from subsequently deposited conductive (or semiconductive) layers. A first insulating layer can include silicon dioxide, preferably silicon dioxide that is doped with phosphorous (phosphosilicate glass or "PSG"). More preferably, the first insulating layer can be doped with boron and phosphorous (borophosphosilicate glass or "BPSG"). A first insulating layer may be deposited using chemical vapor deposition (CVD), or plasma enhanced and plasma assisted CVD (PECVD and PACVD), or high density plasma (HDP) deposition, to name but a few examples. A PSG or BPSG layer can be subject to a "reflow" and/or planarization step.

Figure 2B:
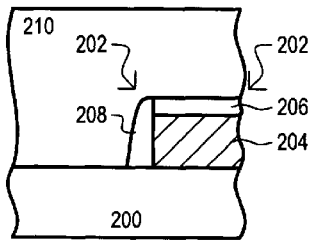

FIG. 2B shows a portion of a semiconductor device following the deposition of a first insulating layer 210. A first insulating layer 210 can insulate a substrate 200 and/or a structure 202 from subsequently deposited conductive (or semiconductive) layer.

A first embodiment 100 may also include depositing a second insulating layer over the first insulating layer (step 106). A second insulating layer can form all or part of a "hard" etch mask for a first insulating layer 210. A second insulating layer 210 can include silicon dioxide, preferably undoped silicon dioxide (undoped silicate glass or "USG"). A second insulating layer may be deposited using chemical vapor deposition (CVD), or plasma enhanced and plasma assisted CVD (PECVD and PACVD), or high density plasma (HDP) deposition, to name but a few examples. A second insulating layer 210 may also be planarized.

Figure 2C:
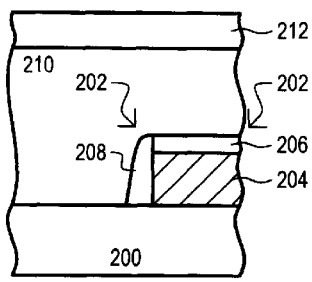

FIG. 2C shows a portion of a semiconductor device following the deposition of a second insulating layer 212. A second insulating layer 212 can be deposited over (but not necessarily on) a first insulating layer 210.

Once a second insulating layer 212 is deposited, a hard etch mask can be formed that can include a second insulating layer 212 (step 108). A step 108 can include forming hard etch mask openings in a second insulating layer 212. One way to form such hard etch mask openings can include conventional lithographic and etch techniques.

Figure 2D:
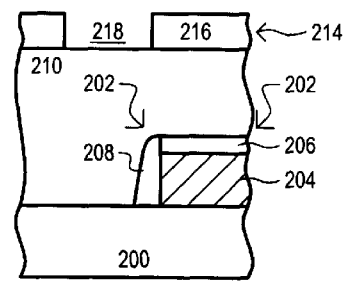

FIG. 2D shows one example of a semiconductor device following a formation of a hard etch mask that includes a second insulating layer 212. A hard etch mask is designated by the general reference character 214, and is shown to include a mask portion 216 and a mask opening 218. A mask portion 216 can include portions of a second insulating layer 212. A mask opening 218 may be formed by removing portions of a second insulating layer 212. A mask opening 218 can be situated over a location where a contact hole may be formed.

With a hard etch mask 214 formed over a first insulating layer 210, a first embodiment 100 can continue by etching a contact hole (step 110). Contact holes can be etched through a first insulating layer 210 to a conductive (or semiconductive) layer below, such as a substrate 200. A contact hole may be anisotropically etched. Anisotropic etching is believed to provide better control over the aspect ratio of the contact hole then an isotropic etch. A contact hole may be preferably formed with an etch having a high degree of selectivity between a first insulating layer 210 and a second insulating layer 212.

A contact hole can preferably be self-aligned with a structure 202, more preferably, self-aligned with a conductive (or semiconductive) structure 202 having a sidewall 208. A contact hole may expose a sidewall 208, but not necessarily result in a sidewall 208 being entirely exposed. None or only a portion of a sidewall 208 may be exposed by a step 110.

Figure 2E:
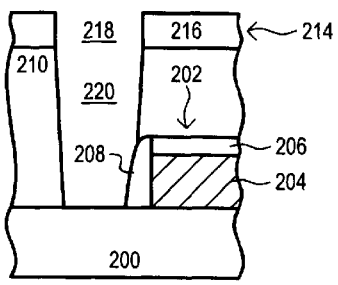

FIG. 2E shows one example of a semiconductor device following a formation of a contact hole 220. A contact hole 220 may be considered "self-aligned", as there may be no minimum spacing requirements between a contact hole 220 and an adjacent structure 202.

In the process described by the first embodiment 100, a hard etch mask 214 can result in a contact hole 220 having a lower aspect ratio than a conventional approach, such as those that may utilize an etch mask that includes photoresist. This may allow the formation of smaller contacts than conventional approaches.

If a hard etch mask 214 includes USG, such a hard etch mask 214 does not necessarily have to be removed after a contact hole 220 is formed. USG can have a lower dielectric constant than other hard etch mask materials, such as silicon nitride, for example. Consequently, the potential for parasitic effects, can be less than other conventional approaches that can introduce higher dielectric constant materials.

If a hard etch mask 214 of USG is formed over a first insulating layer of BPSG and/or PSG, the hard etch mast 214 can further function as a "cap" oxide. A cap oxide may stabilize a BPSG and/or PSG layer and/or prevent the out-diffusion of BPSG and/or PSG dopants.

Figure 3:
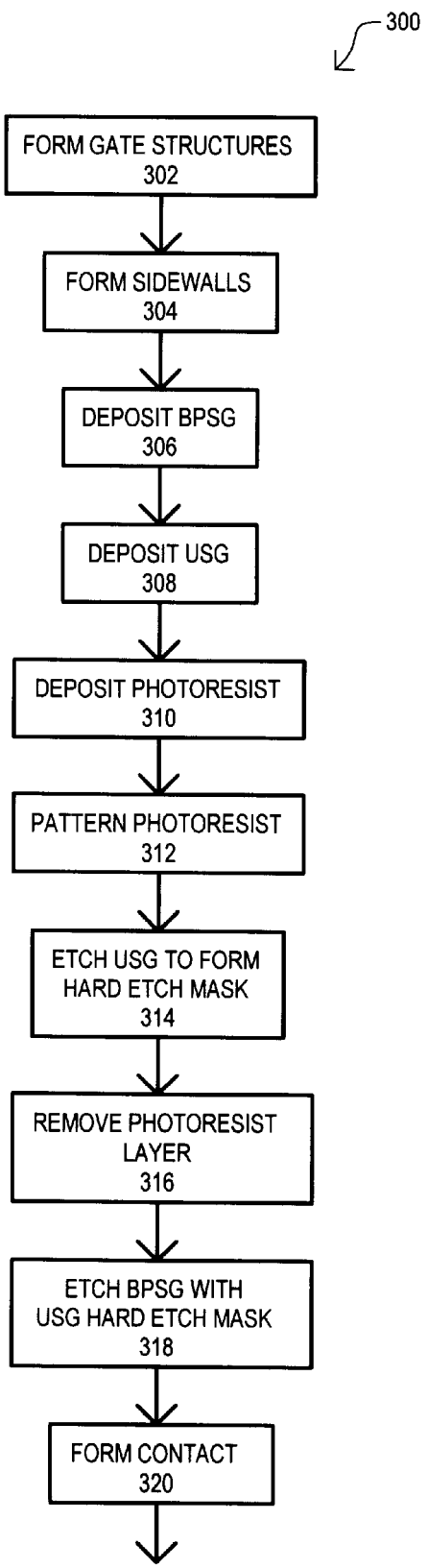
FIG. 3 is a flow diagram of a second embodiment.

Referring now to FIG. 3, a flow diagram shows a third embodiment 300. A third embodiment 300 includes a method for forming a self-aligned contact in an integrated circuit that may include insulated gate field effect transistors (IGFETs). One example of an IGFET is a metal-oxide-semiconductor (MOS) FET. A second embodiment 300 may include a first step of forming gate structures (step 302).

Forming gate structures may include depositing one or more conductive (or semiconductive) gate layers over a gate insulator. A top insulating layer can also be deposited over the conductive gate layer(s).

Figure 4A:
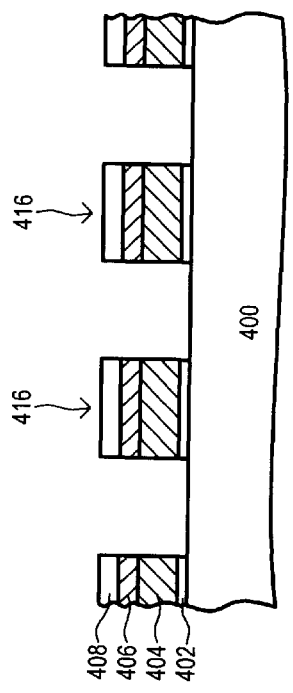
FIGS. 4A to 4M are side cross-sectional views of a semiconductor device according to a second embodiment.

FIG. 4A shows a side cross sectional view following a deposition of gate materials. A semiconductor device includes a substrate 400 on which a gate insulator 402, a first gate conductive layer 404, and a second gate conductive layer 406 may be formed. A top insulating layer 408 may be formed over a second gate conductive layer 406.

Forming a gate structure may further include forming a pattern in deposited gate conductive layers (404 and 406) and/or a top insulating layer 408. Such a pattern forming step may include conventional lithography and etch steps.

Figure 4B:
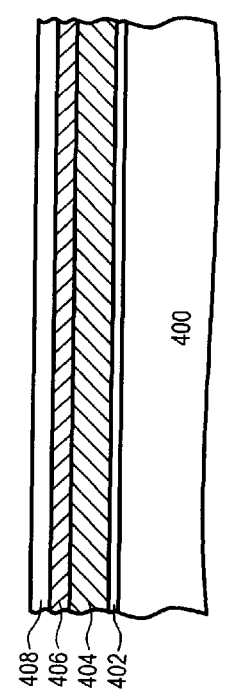

FIG. 4B shows a side cross sectional view following a patterning of gate materials with conventional lithographic and etch steps. A gate etch mask 410 can be formed over a top insulating layer 408. A gate etch mask 410 may be formed from photoresist as just one example. A gate etch mask 410 can include gate mask portions 412 and gate mask openings 414. Portions of the gate conductive layers (404 and 406) and top insulating layer 408 exposed by gate mask openings 414 can be removed by a gate etch. Preferably, the gate etch can be a reactive ion etch (RIE). A gate etch mask 410 may then be removed.

Figure 4C:
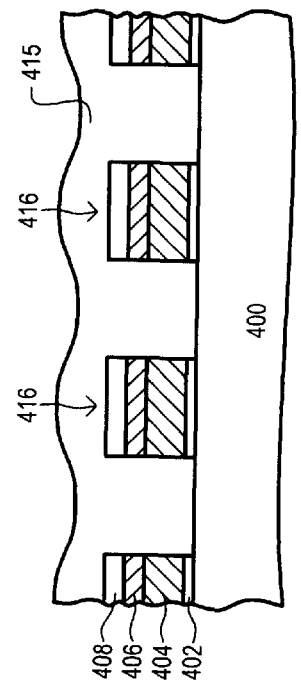

FIG. 4C illustrates a semiconductor device after a gate etch mask 410 has been removed. Gate stacks 416 can be formed over a substrate 400.

Figure 4D:
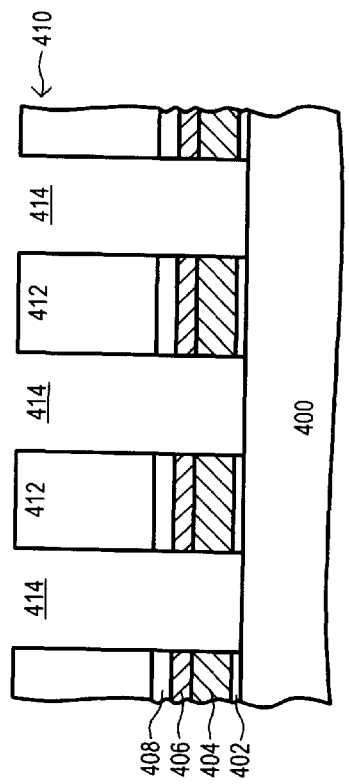
Figure 4E:
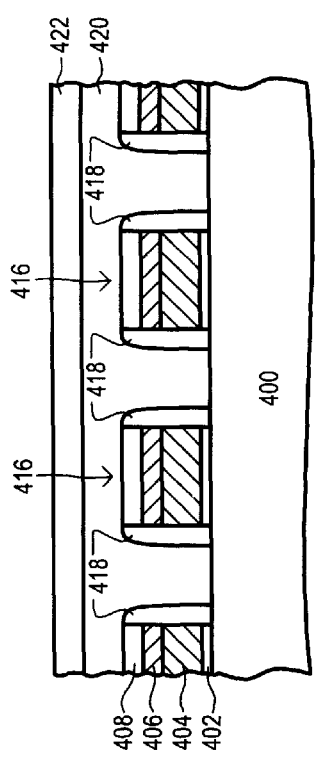

The second embodiment 300 can continue by forming sidewalls on gate stacks 416 (step 304). One approach to forming sidewalls is shown in FIGS. 4D and 4E. The illustrated approach can include depositing a layer of undoped silicon dioxide over gate stacks 416. A semiconductor device following the deposition of undoped silicon dioxide 415 is set forth in FIG. 4D. Portions of the silicon dioxide may be removed with an anisotropic etch to form sidewalls (or "spacers"). Gate stacks 416 with accompanying sidewalls 418 are illustrated in FIG. 4E. Sidewalls 418 may provide insulation for the lateral edges of gate stacks 416, and may thus allow contacts to be self-aligned with gate stacks 416.

Figure 4G:
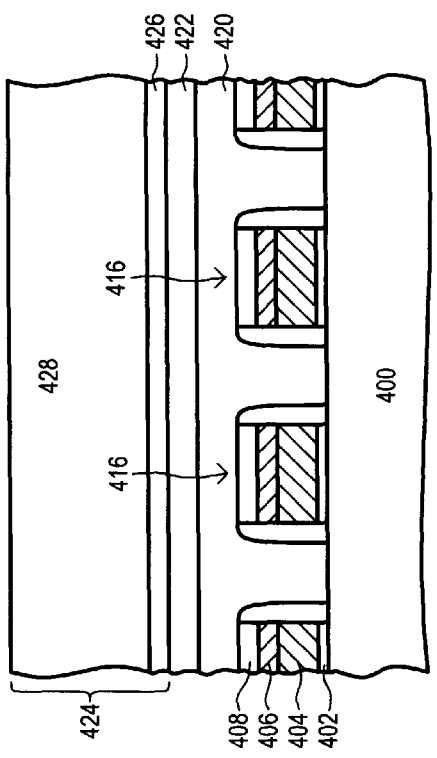
Figure 4F:
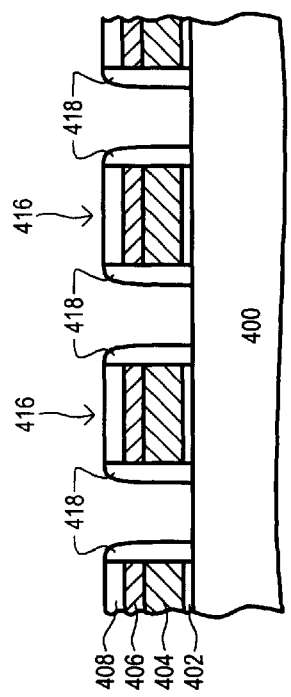

The second embodiment 300 can further include depositing a layer of BPSG over the gate stacks 416 (step 306). FIG. 4F illustrates a layer of BPSG 420 formed over gate stacks 416. BPSG can be deposited according to conventional PECVD techniques. However, the invention should not be construed as being limited to such an insulating layer or deposition technique. As just one example, phosphosilicate glass (PSG) may be deposited over gate stacks 416. Other examples have been discussed in conjunction with the first embodiment 100.

A BPSG layer 420 may be planarized after it is deposited. Planarization can include a chemical-mechanical polishing (CMP) step, to name just one example. Alternatively, planarizing may be accomplished by an isotropic etching step, or by a relatively low temperature and/or short duration reflow step, but CMP is preferred.

Once a BPSG layer 420 is deposited, the second embodiment 300 can continue with a deposit USG step 308. As shown in FIG. 4G, a layer of USG 422 can be deposited over a BPSG layer 420. In the second embodiment 300, a USG layer 422 can be deposited according to conventional PECVD techniques, and then planarized. However, different deposition methods could be employed. Some such methods have been discussed in conjunction with the first embodiment 100.

Figure 4H:
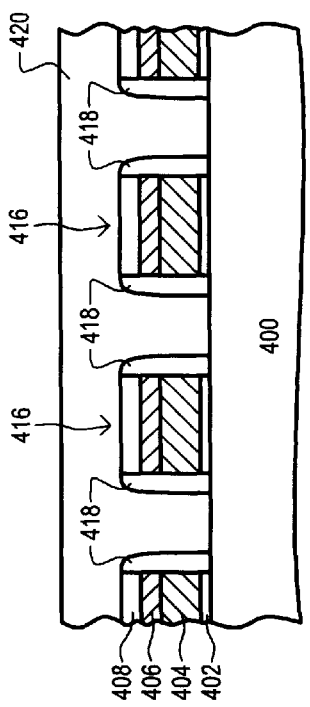

As shown in FIG. 3, a second embodiment 300 can continue by depositing a layer of photoresist over a USG layer 422 (step 310). A semiconductor device following a step 310 is set forth in FIG. 4H. A photoresist layer 424 has been formed over a USG layer 422 that can include a bottom antireflective coating (BARC) 426 and a photoresist material 428.

Once a photoresist layer 424 is deposited, such a layer can be patterned (step 312). A patterning step can include a conventional lithography step. Selected portions of photoresist material 428 can be exposed to radiation. Selective exposure can be accomplished with a photomask, or by way of beam writing technology. Such exposure can produce a contact hole pattern in a photoresist material 428. Depending upon the type of photoresist material used (i.e., positive or negative), selected portions of a photoresist material 428 can be removed and the resulting pattern subjected to heat ("baked"). In this way, a contact hole pattern may be formed.

Figure 4K:
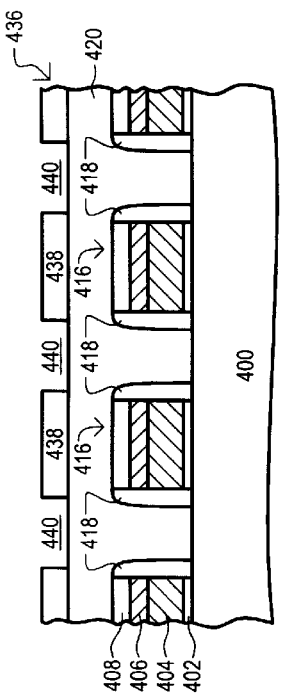
Figure 4L:
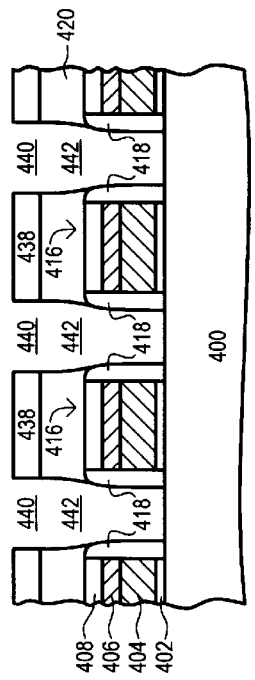
Figure 4M:
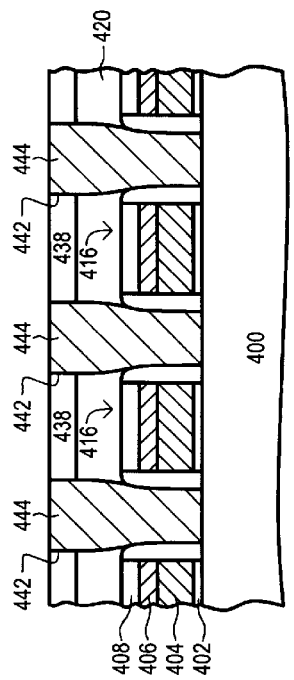
Figure 4I:
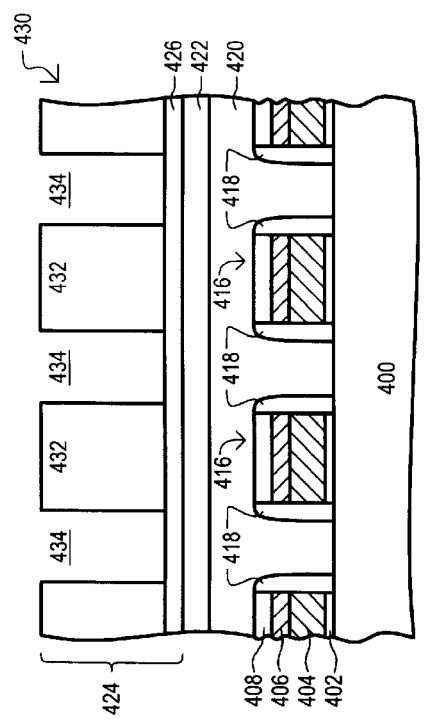

FIG. 4I shows a side cross-sectional view of a semiconductor device following the formation of a contact hole pattern 430. A contact hole pattern 430 can include contact mask portions 432 and contact location openings 434. Contact location openings 434 can be situated over the locations where a contact may be formed. In the particular arrangement of FIG. 4I, the patterning of a photoresist layer 424 can expose a BARC 426.

The second embodiment 300 can further include a step that etches a USG layer 422 to form a hard etch mask (step 314). In one particular arrangement, a RIE step having a high degree of selectivity between USG and photoresist can transfer a photoresist contact hole pattern 430 to a USG layer 422. A semiconductor device following such a step 314 is shown in FIG. 4J.

Figure 4J:
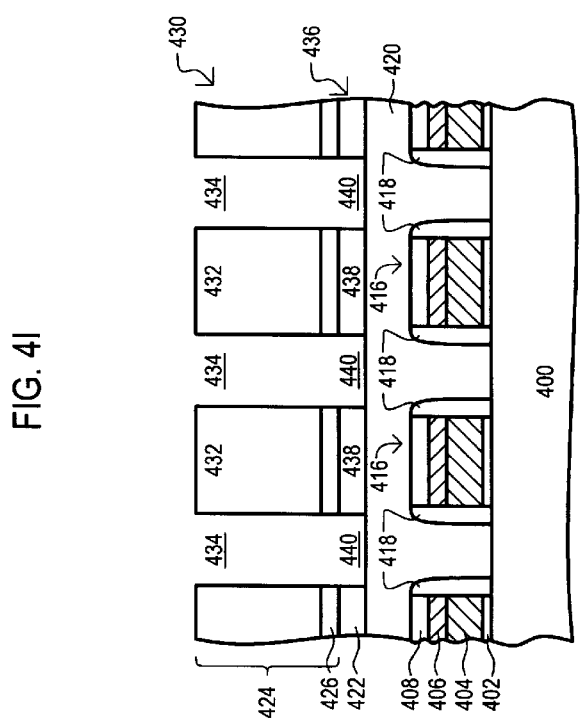
Figure 5:
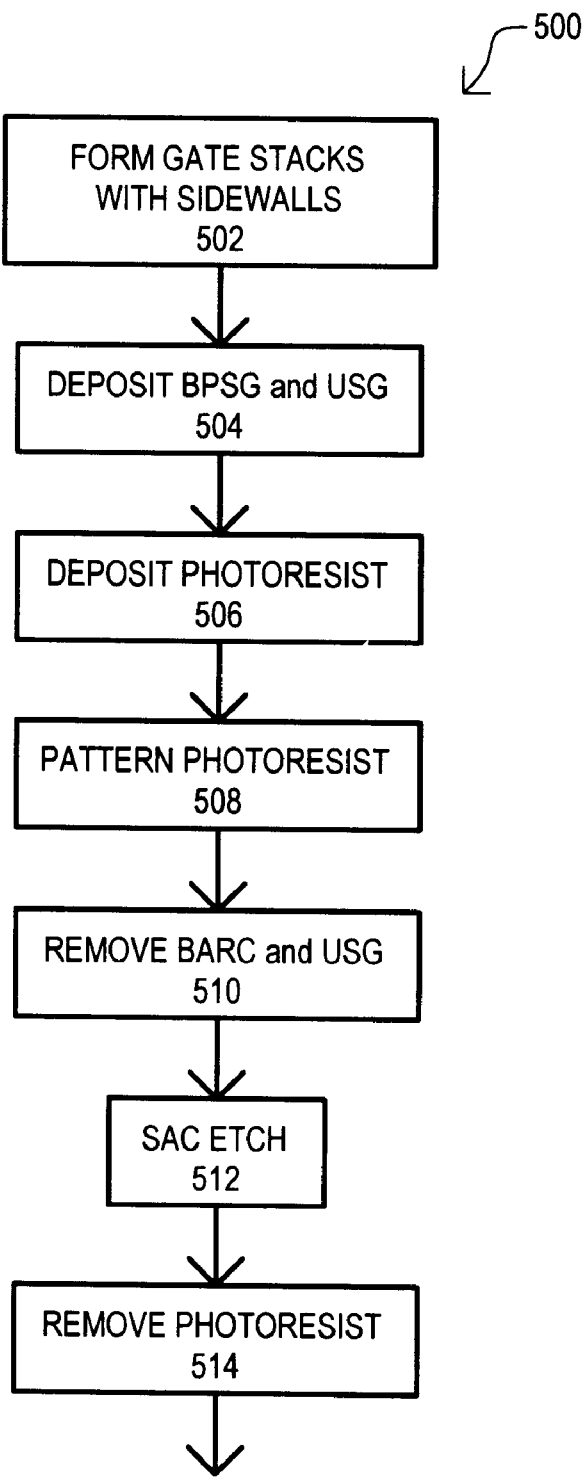
FIG. 5 is a flow diagram of a conventional self-aligned contact process.
Figure 7:
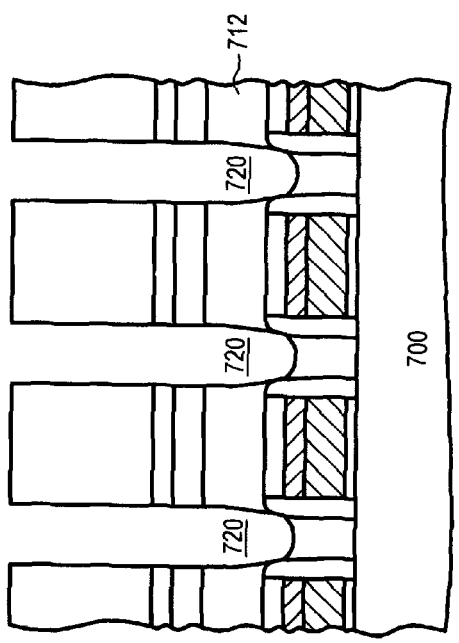
FIG. 7 is a side cross-sectional view of a conventional semiconductor device having a failed self-aligned contact etch.
Figure 6F:
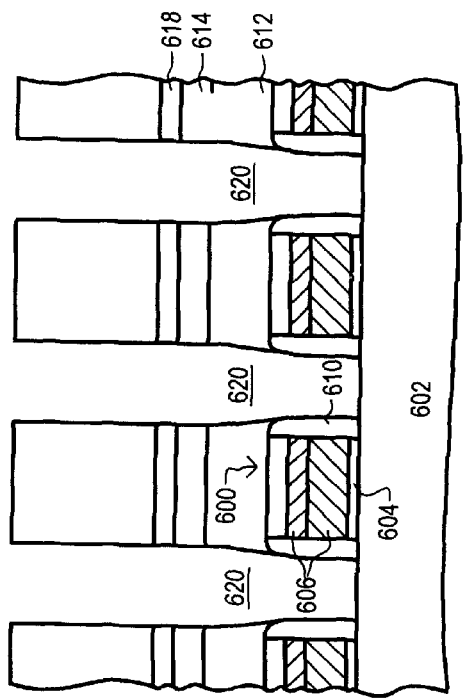
Figure 6G:
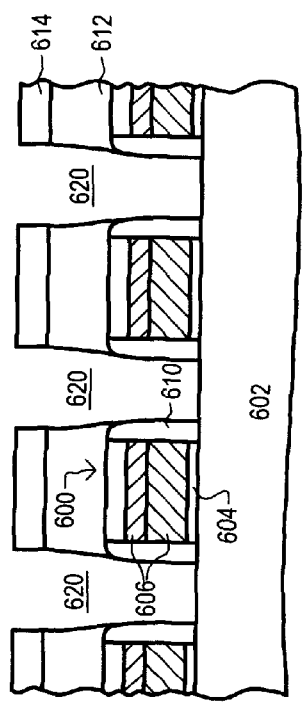

In FIG. 4J, portions of a BARC 426 and USG layer 422 have been removed according to a photoresist contact hole pattern 430. Consequently, a hard etch mask 436 has been formed that includes a USG layer 422. In the particular arrangement of FIG. 4J, a hard etch mask 436 can include hard mask portions 438 and hard mask openings 440. Hard mask openings 440 may be situated over a location where a contact hole may be formed, preferably a self-aligned contact hole.

It is noted that a photoresist contact hole pattern 430, if used as a contact hole etch mask, would add significantly to an aspect ratio for a contact hole. Further, in the particular arrangement of FIG. 4J the thickness of the hard etch mask 436 may be less than a thickness of the photoresist contact hole pattern 430.

Unlike a conventional approach to forming self-aligned contacts, a second embodiment 300 can remove a photoresist layer 424 prior to forming a contact hole (step 316). Such a step can include "ashing" a photoresist layer 424 with a plasma etch, or the like. Of course, other conventional photoresist removal techniques can be utilized, according to the particular type of photoresist layer 424.

FIG. 4K illustrates a semiconductor device following the removal of a photoresist layer 424. A hard etch mask 436 that includes USG may be formed over a BPSG layer 420. It is noted that removal of a photoresist layer 424 can result in a hard self-aligned contact etch mask that produces a smaller aspect ratio for contact holes than other conventional approaches, such as those that use photoresist as an etch mask.

Once a hard etch mask 436 is formed, a self-aligned contact ("SAC") etch may be performed (step 318). A SAC etch may be a substantially anisotropic reactive ion etch (RIE). Such a RIE SAC etch may be more selective to a BPSG layer 420 than a USG hard etch mask 436.

A portion of an integrated circuit following a step 318 is set forth in FIG. 4L. Contact holes 442 may be formed below hard mask openings 440. A contact hole 442 (including its hard etch mask 436) may have a smaller aspect ratio than conventional approaches. Consequently, smaller contact geometries may be achievable. As just a few examples, aspect ratios of less than or equal to 7:1, or preferably less than or equal to 5:1, may be formed with a hard etch mask 436. Further, contact geometries of 0.25 μm or smaller, preferably 0.20 μm, more preferably 0.18 μm or smaller, may be formed.

While contact holes formed according to the second embodiment 200 are self-aligned, the teachings of the second embodiment 300 may be used to form contacts that are not self-aligned, and/or vias.

It is understood that the invention should not be construed as being limited to BPSG 420 as a lower insulating layer and USG 422 as a hard etch mask layer. Other materials may be used with a contact etch having a high degree of selectivity between a hard etch mask layer and a lower insulating layer through which contacts can be formed.

It is further noted that a USG hard etch mask can have the advantages described above. Namely, a low dielectric constant relative to alternate hard etch mask materials, and an ability to function as a cap layer for BPSG and/or PSG.

A second embodiment 300 can also include forming a contact (step 320). A contact may be formed by depositing one or more conductive materials in a contact hole, as just one example. A subsequent planarization step may then be applied to provide a substantially planar surface. A portion of an integrated circuit following a step 316 is set forth in FIG. 4M.

FIG. 4M illustrates contacts 444 formed within contact holes 442. A contact 444 may provide an essentially vertical conductive path through a BPSG layer 420 to a substrate 400.

While the particular arrangement of FIG. 4M illustrates a contact structure in which a hard etch mask 436 has been retained, it is understood that a hard etch mask 436 could be removed prior to the formation of a contact.

A number of embodiments have been described setting forth approaches to forming a contact hole and/or a self-aligned contact hole with a hard etch mask. Such approaches may be implemented in existing fabrication processes to take advantage of the benefits of the various methods and structures described. As just one example, a manufacturer may alter its current fabrication process, which might form contacts with an etch mask of photoresist, or the like, to a new process flow that can form contacts with a hard contact etch mask having a smaller thickness than a photoresist etch mask. In addition, or alternatively, a hard etch mask can be retained (i.e., not removed) and have a relatively low dielectric constant.

Further, by utilizing the advantageous lower aspect ratio contact holes illustrated by the disclosed embodiments, a manufacturer may be capable of re-tooling a fabrication process to accommodate smaller geometry devices, as smaller contact hole aspect ratios may produce smaller geometry contacts.

A structure formed according to an embodiment may include contact holes formed through two insulating layers. A second insulating layer can be formed over a first insulating layer and function as a hard etch mask for a first insulating layer. Side cross sectional views of a hard etch mask may show more rounded corners than a conventional approach that utilizes a photoresist etch mask to etch through a first insulating layer and a second insulating layer. Of course, other etch approaches may not produce such a corner rounding effect.

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. A method, comprising:

forming a first insulating layer over a substrate;

forming a second insulating layer over the first insulating layer, the second insulating layer including a layer of substantially undoped silicon dioxide; and forming a hard etch mask that includes the second insulating layer, the hard etch mask including hard mask portions that include the second insulating layer and hard mask openings below which contact holes may be formed.

2. The method of claim 1, wherein:

the first insulating layer includes silicon dioxide doped with phosphorous.

3. The method of claim 2, wherein:

the silicon dioxide is further doped with boron.

4. The method of claim 1, further including:

etching a contact hole through the first insulating layer with the hard etch mask as a contact hole etch mask.

5. The method of claim 4, wherein:

a conductive line is formed on the substrate, the conductive line including a sidewall; and the etched contact hole is self-aligned with the conductive line.

6. The method of claim 4, wherein:

the conductive line is a gate of an insulated gate field effect transistor.

7. The method of claim 4, wherein:

the aspect ratio of the contact hole, including the hard etch mask, is less than 8:1.

8. The method of claim 7, wherein:

the aspect ratio of the contact hole, including the hard etch mask, is less than 5:1.

9. The method of claim 4, wherein:

the contact hole has a width less than or equal to 0.25 $\mu$m.

10. The method of claim 4, wherein:

the contact hole has a width less than or equal to 0.18 $\mu$m.

11. A method, comprising:

depositing a first insulating layer over a structure comprising a transistor gate and a sidewall adjacent to said transistor gate;

depositing a second insulating layer over the first insulating layer, the second insulating layer having a dielectric constant less than 6;

forming a hard etch mask that includes the second insulating layer; and etching a contact hole through the hard etch mask with an etch process having a high degree of selectivity between the first insulating layer and the second insulating layer.

12. The method of claim 11, wherein:

the first insulating layer includes substantially undoped silicon dioxide; and the second insulating layer includes silicon dioxide doped with phosphorous.

13. The method of claim 12, wherein:

the second insulating layer is further doped with boron.

14. The method of claim 11, further including:

depositing a conductive layer over the hard etch mask.

15. A method of forming a contacts, comprising the steps of:

depositing a first insulating layer;

depositing a second insulating layer over the first insulating layer, the second insulating layer having a first thickness;

forming a pattern of photoresist over the second insulating layer that includes a contact hole pattern, the pattern of photoresist having a second thickness greater than the first thickness;

etching the second insulating layer through the pattern of photoresist to form a hard contact hole etch mask in the second insulating layer;

removing the pattern of photoresist; and etching the first insulating layer through the hard contact hole etch mask to form a contact hole.

16. The method of claim 15, wherein:

the contact hole, including the hard etch mask, has an aspect ratio of less than 8:1.

17. The method of claim 16, wherein:

the contact hole has a width of 0.25 $\mu$m or less.

18. The method of claim 16, wherein:

the contact hole has a width of 0.18 $\mu$m or less.

19. The method of claim 16, wherein:

the contact hole, including the hard etch mask, has an aspect ratio of less than 5:1.

20. The method of claim 15, wherein:

the second insulating layer includes a layer of substantially undoped silicon dioxide.

* * * * *